United States Patent [19]
Boe

[11] Patent Number: 6,023,827
[45] Date of Patent: Feb. 15, 2000

[54] CAM HEAT SINK CLIP INSTALLATION AND REMOVAL TOOL AND METHOD

[75] Inventor: Craig L. Boe, Nampa, Id.

[73] Assignee: Micron Electronics, Inc., Nampa, Id.

[21] Appl. No.: 09/009,627

[22] Filed: Jan. 20, 1998

[51] Int. Cl.[7] .................................................. B23P 11/00
[52] U.S. Cl. .......................................................... 29/243.56
[58] Field of Search ............................... 29/243.56, 238, 29/240, 242, 225, 229, 230

[56] References Cited

U.S. PATENT DOCUMENTS

| | | | |
|---|---|---|---|
| 2,126,225 | 8/1938 | Simons | 29/243.56 |
| 3,271,847 | 9/1966 | Millheiser | 29/229 |
| 5,007,313 | 4/1991 | Jeromson, Jr. et al. | 29/229 |
| 5,208,731 | 5/1993 | Blomquist . | |
| 5,209,143 | 5/1993 | Sweet | 29/229 |
| 5,304,735 | 4/1994 | Earl et al. | 174/16.3 |
| 5,381,305 | 1/1995 | Harmon et al. . | |
| 5,448,449 | 9/1995 | Bright et al. . | |
| 5,581,442 | 12/1996 | Morosas . | |
| 5,826,467 | 10/1998 | Huang | 29/229 |

*Primary Examiner*—David A. Scherbel
*Assistant Examiner*—Lee Wilson
*Attorney, Agent, or Firm*—Craig M. Korfanta

[57] ABSTRACT

A tool for the installation and removal of a lever cam operated spring clip. One embodiment of the invention has a pair of levers pivotally attached together, with one of the levers configured to frictionally engage the cam lever and the other lever configured to engage the clip's outer perimeter. Once the tool is installed on a lever operated cam spring clip, a slight squeeze of the two levers spreads the clip hooks to a position where the clip can be installed over a heat sink and engaged with an underlying electronic device. Pivoting the tool about the cam pivots the cam about its axis until the clip is locked into place. The tool can then be disengaged from the cam lever. Removal of the clip is accomplished by reversing the process.

22 Claims, 2 Drawing Sheets

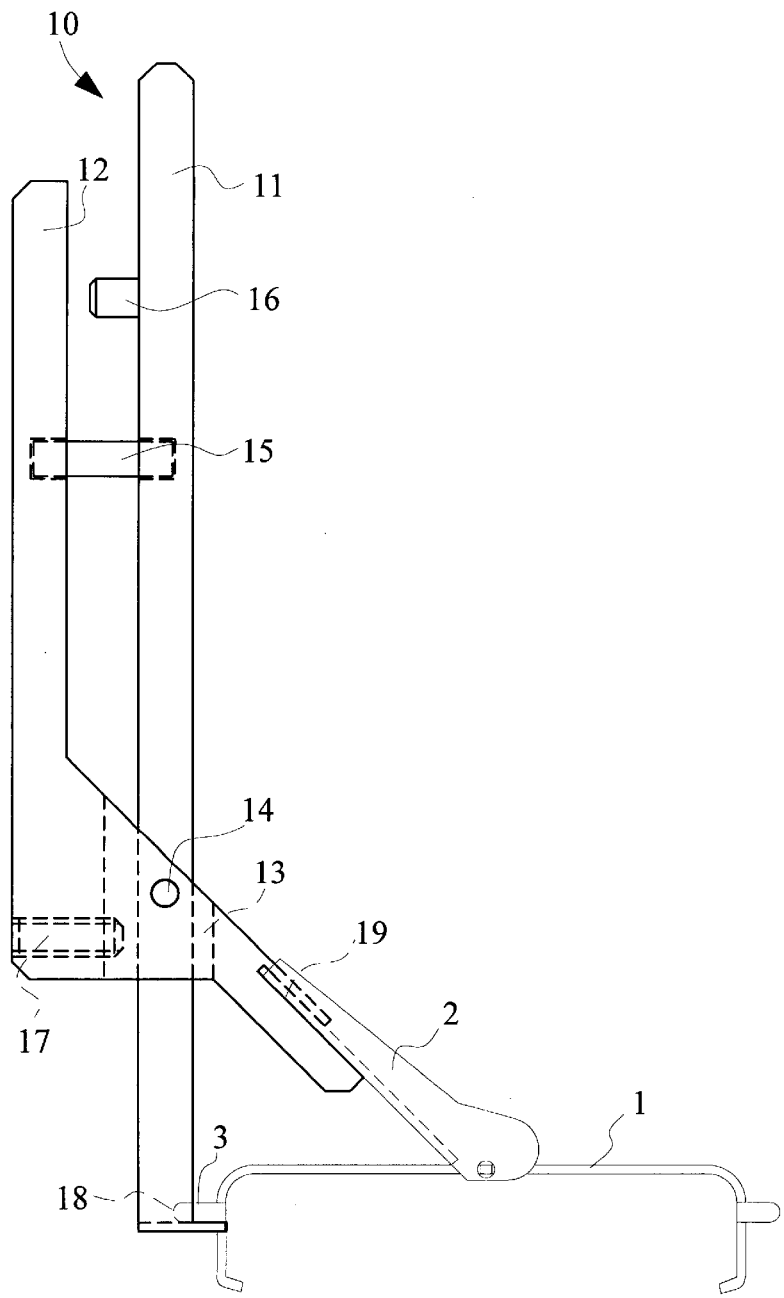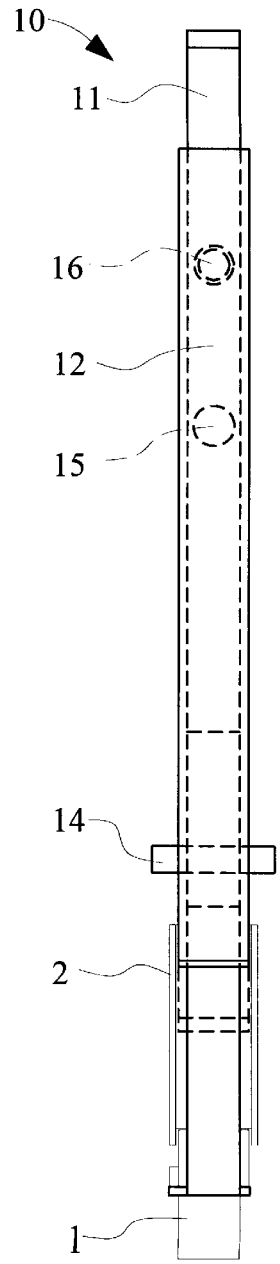
Fig. 1
Fig. 2

CAM HEAT SINK CLIP INSTALLATION AND REMOVAL TOOL AND METHOD

BACKGROUND OF THE INVENTION

1. Technical Field

This invention generally relates to the attachment and removal of a heat sink to a semiconductor device. More particularly, this invention relates to a tool for attaching and removing a cam lever operated heat sink spring clip.

2. Background

The current path density in present day monolithic semiconductor devices, such as a microprocessor, result in a relatively large amount of heat being generated over a very small geometry. Consequently, heat sinks are attached to a large surface area of the device to conduct heat away from the device. Due to the differing coefficient of thermal expansion, the heat sinks are not typically glued or otherwise permanently attached to the device. Instead, the heat sinks are clipped or otherwise held in contact with the large surface area.

Several different clip configurations have been invented to accomplish the attachment between the heat sink and the electronic device. U.S. Pat. Nos. 5,581,442, 5,448,449, 5,381,305, 5,280,731 and 5,304,735 are typical of these kinds of devices. In particular, U.S. Pat. No. 5,304,735 to Earl et al., teaches a C-shaped heat sink clip for attaching a specially configured heat sink to a grid array electronic device, here a pin grid array (PGA) device. In addition, this patent teaches two specialized tools for installation and removal of the clips. Both of the installation and removal tools generally resemble a pair of pliers, with the installation tool being a crimping style tool and the removal tool being a spreading pliers type tool.

In general, clip manufacturers have endeavored to design clips which can be installed and removed without specialized tools, which facilitates removal and replacement of heat sinks in the field by service technicians. However, oftentimes the design of the these type of clips do not facilitate installation or removal of the clips in a mass production environment. In this type of environment, it is oftentimes much more desirable to have a specialized tool to speed up the production process.

DISCLOSURE OF THE INVENTION

One embodiment of the invention is particularly configured to aid in the installation and removal of a lever cam operated spring clip. This embodiment of the invention has a pair of levers pivotally attached together, with one of the levers configured to frictionally engage the cam lever and the other lever configured to engage the clip's outer perimeter. Once the tool is installed on a lever operated cam spring clip, a slight squeeze of the two levers spreads the clip hooks to a position to where the clip can be installed over the heat sink and engaged with the underlying electronic device. Releasing the levers allows the clip perimeter engaging lever to become disengaged from the clip. Pivoting the tool then about the cam pivots the cam about its axis until the clip is locked into place. The tool can then be disengaged from the cam lever. Removal of the clip is accomplished y reversing the process.

BRIEF DESCRIPTION OF THE DRAWINGS

FIG. 1 is a side view of a cam spring clip tool attached to a lever operated cam spring clip;

FIG. 2 is a rear view of a cam spring clip tool attached to a lever operated cam spring clip;

DETAILED DESCRIPTION OF THE INVENTION

Figure 3A:
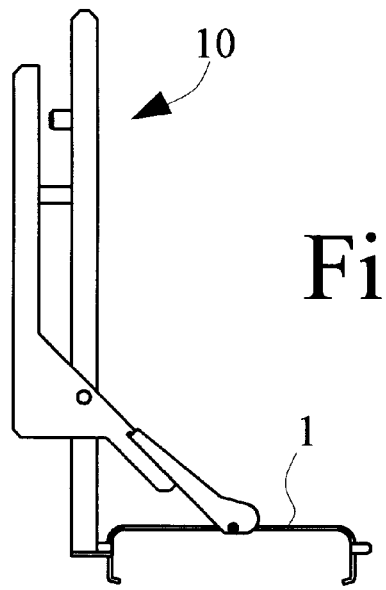
FIG. 3A is a side view of a cam spring clip tool attached to a lever operated cam spring clip in either a starting position for installation or an ending position for removal of the spring clip.

Referring now to the FIGS. 1–3(A–C), one embodiment of a heat sink spring clip installation and removal tool, generally designated at 10 in the figures, will be described in detail. The embodiment shown and described is simply illustrative of one embodiment which is particularly suited for the installation and removal of one configuration of a lever cam spring clip generally designated at 1 in the figures. This particular spring clip has a lever 2 which includes an eccentricly positioned cam portion which serves to tension the main clip body upon rotation of lever 2. The main body of spring clip 1 includes one or more clip ridges 3 positioned on depending hook portions 4 of the main body. Depending hook portions 4 serve to grasp the underside of an electronic component, such as a microprocessor, to attach a heat sink between the microprocessor and spring clip 1.

Cam spring clip tool 10 may include a first lever 11 to which a second lever 12 is pivotally attached via a pivot pin 14. Pivot pin 14 may, as is shown in the figures, be a press fit pin. Or, pivot pin 14 may be a nut and bolt, rivet or similar fastener. Advantageously, first and second levers 11 and 12 may be positioned to pivot in the same plane so that one lever is not offset from the other. This may be accomplished by pivotally attaching first lever 11 to second lever 12 through a first lever receiving slot 13 formed in second lever 12, or vice versa. Alternatively, this could be accomplished by forming offset or recessed portions in either or both levers, similar to the configuration of common pliers.

A lever biasing mechanism 15 is employed between levers 11 and 12 to force the handle portions of levers 11 and 12 apart. Here a compressive spring may be attached toward the handle portions with respect to the pivot or fulcrum point. Alternatively, a tensive spring device could be attached toward the working end of the levers or a torsion spring applied between the levers about the pivot point. A first lever stop 16, which may be fixed or adjustable, may be attached toward the handle end of one of the levers, here lever 11. First stop 16 serves to limit the range of compression between the handle ends of levers 11 and 12. The compression of the handle ends of levers 11 and 12 facilitates the expansion or opening of spring clip 1 as explained below. A second lever stop 17, which also may be fixed or adjustable, may be attached toward the working end of one of the levers, here lever 12. Second stop 17 serves to limit the range of expansion between the working ends of levers 11 and 12 due to the biasing force of biasing mechanism 15.

A clip ridge engagement surface 18 may be formed at or near the working end of lever 11. Here, engagement surface 18 is formed by forming a notch in lever 11 which is sized and shaped to receive clip ridge 3. One or more registration guide legs 20 may be formed on adjacent sides of the notch to help align clip 1, hold ridge 3 to engagement surface 18 and even increase the effective surface area of engagement surface 18.

A lever engagement surface 19 may be formed at or near the working end of lever 12. Lever engagement surface 19 may be formed as is shown here by forming a cam lever web receiving slot through the cross section of the end portion, along the longitudinal length of the working end of lever 12. Here, the upper slot defining portion is foreshortened with respect to the lower portion to facilitate frictional engagement of lever 12 with lever 2.

Figure 3B:
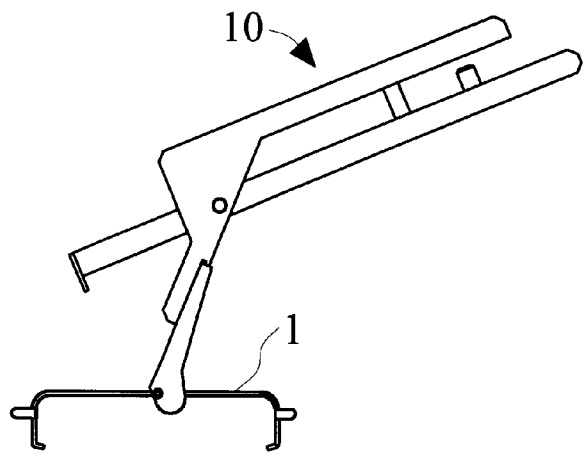
FIG. 3B is a side view of a cam spring clip tool attached to a lever operated cam spring clip in an intermediate position for installation and removal of the spring clip.
Figure 3C:
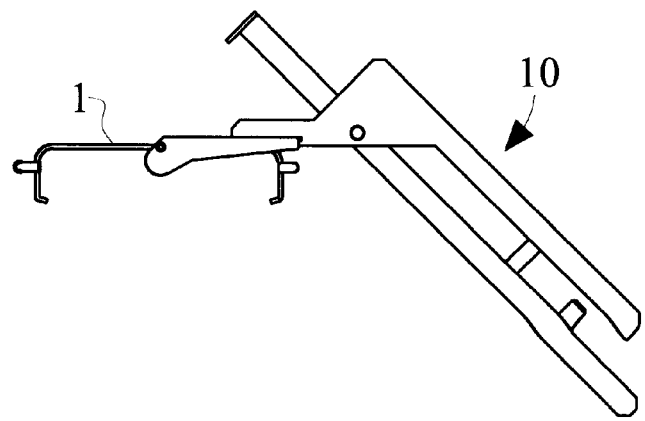
FIG. 3C is a side view of a cam spring clip tool attached to a lever operated cam spring clip in either an ending position for installation or a starting position for removal of the spring clip.

Referring especially to FIGS. 3A–3C, in use, lever engagement surface 19 of lever 12 is frictionally engaged with the distal end cam lever 2 by sliding lever 2 into the slot. Clip ridge engagement surface 18 is then engaged with clip ridge 3 on the clips outer perimeter, perhaps requiring a slight compression of spring slip 1. Once tool 10 is installed on a lever operated cam spring clip, a slight squeeze of the handle ends of levers 11 and 12 spreads the clip hooks to a position to where clip 1 can be installed over the heat sink and engaged with the underlying electronic device. Releasing levers 11 and 12 allows clip ridge engagement surface 18 to become disengaged from clip ridge 3. Pivoting tool 10 then about the cam pivots the cam about its axis until clip 1 is locked into place. Tool 10 can then be disengaged from cam lever 2. Removal of a clip is accomplished by reversing the process.

While there are shown and described specific embodiments of the invention, it is to be distinctly understood that this invention is not limited thereto but may be variously embodied to practice within the scope of the following claims.

I claim:

1. An apparatus for manipulating lever operated cam spring clips which comprises:

a first lever having a handle end and a working end;

a second lever having a handle end and a working end, the first and second levers being pivotally attached together;

the working end of the second lever having a cam operated spring clip lever engagement surface thereon configured and positioned to captively engage a cam lever along a longitudinal axis thereof such that a unidirectional force applied to a spring clip having a hook portion, the spring clip being attached to the first and second levers having said unidirectional force causing a rotation of the cam lever about a pivot point; and the working end of the first lever having a spring clip engagement surface thereon configured to engage a portion of the hook portion on the spring clip.

2. The apparatus of claim 1 further comprising a lever biasing mechanism attached between the first and second levers to force the working ends of the levers apart.

3. The apparatus of claim 1 further comprising a lever stop being positioned on one of the first and second levers to limit the compression of the working ends toward one another.

4. The apparatus of claim 3 further comprising a second lever stop being positioned on one of the first and second levers to limit the compression of the handle ends toward one another.

5. The apparatus of claim 3 wherein the cam operated spring clip lever engagement surface is defined by a slot in the working end of the first lever which is sized and shaped to slidably receive a web of the cam operated spring clip lever.

6. The apparatus of claim 3 wherein the spring clip engagement surface is includes a notch in the working end of the second lever which is sized and shaped to frictionally engage a ridge on the periphery of a hook portion on the spring clip lever.

7. The apparatus of claim 2 further comprising a lever stop being positioned on one of the first and second levers to limit the compression of the working ends toward one another.

8. The apparatus of claim 7 further comprising a second lever stop being positioned on one of the first and second levers to limit the compression of the handle ends toward one another.

9. The apparatus of claim 7 wherein the cam operated spring clip lever engagement surface is defined by a slot in the working end of the first lever which is sized and shaped to slidably receive a web of the cam operated spring clip lever.

10. The apparatus of claim 2 further comprising a lever stop being positioned on one of the first and second levers to limit the compression of the handle ends toward one another.

11. The apparatus of claim 2 wherein the cam operated spring clip lever engagement surface is defined by a slot in the working end of the first lever which is sized and shaped to slidably receive a web of the cam operated spring clip lever.

12. The apparatus of claim 11 wherein the spring clip engagement surface is includes a notch in the working end of the second lever which is sized and shaped to frictionally engage a ridge on the periphery of a hook portion on the spring clip lever.

13. The apparatus of claim 7 wherein the spring clip engagement surface is includes a notch in the working end of the second lever which is sized and shaped to frictionally engage a ridge on the periphery of a hook portion on the spring clip lever.

14. The apparatus of claim 2 wherein the spring clip engagement surface is includes a notch in the working end of the second lever which is sized and shaped to frictionally engage a ridge on the periphery of a hook portion on the spring clip lever.

15. The apparatus of claim 1 further comprising a lever stop being positioned on one of the first and second levers to limit the compression of the working ends toward one another.

16. The apparatus of claim 15 further comprising a second lever stop being positioned on one of the first and second levers to limit the compression of the handle ends toward one another.

17. The apparatus of claim 15 wherein the cam operated spring clip lever engagement surface is defined by a slot in the working end of the first lever which is sized and shaped to slidably receive a web of the cam operated spring clip lever.

18. The apparatus of claim 15 wherein the spring clip engagement surface is includes a notch in the working end of the second lever which is sized and shaped to frictionally engage a ridge on the periphery of a hook portion on the spring clip lever.

19. The apparatus of claim 1 further comprising a lever stop being positioned on one of the first and second levers to limit the compression of the handle ends toward one another.

20. The apparatus of claim 1 wherein the cam operated spring clip lever engagement surface is defined by a slot in the working end of the first lever which is sized and shaped to slidably receive a web of the cam operated spring clip lever.

21. The apparatus of claim 20 wherein the spring clip engagement surface is includes a notch in the working end of the second lever which is sized and shaped to frictionally engage a ridge on the periphery of a hook portion on the spring clip lever.

22. The apparatus of claim 1 wherein the spring clip engagement surface is includes a notch in the working end of the second lever which is sized and shaped to frictionally engage a ridge on the periphery of a hook portion on the spring clip lever.

* * * * *